(12) United States Patent
Ware

(10) Patent No.: US 10,114,037 B2
(45) Date of Patent: Oct. 30, 2018

(54) SYSTEMS AND METHODS FOR CURRENT AND VOLTAGE MONITORING

(71) Applicant: SCHNEIDER ELECTRIC IT CORPORATION, West Kingston, RI (US)

(72) Inventor: Gary R. Ware, Newton, MA (US)

(73) Assignee: SCHNEIDER ELECTRIC IT CORPORATION, West Kingston, RI (US)

(*) Notice: Subject to any disclaimer, the term of this patent is extended or adjusted under 35 U.S.C. 154(b) by 580 days.

(21) Appl. No.: 14/611,551

(22) Filed: Feb. 2, 2015

(65) Prior Publication Data
US 2015/0145501 A1 May 28, 2015

Related U.S. Application Data

(62) Division of application No. 13/194,484, filed on Jul. 29, 2011, now Pat. No. 8,949,053.

(51) Int. Cl.
*G01R 1/04* (2006.01)
*G01R 19/00* (2006.01)
*G01R 15/14* (2006.01)

(52) U.S. Cl.
CPC ......... *G01R 1/0416* (2013.01); *G01R 15/142* (2013.01); *G01R 19/00* (2013.01); *G01R 19/0084* (2013.01); *G01R 19/0092* (2013.01)

(58) Field of Classification Search
CPC ... G01R 21/06; G01R 19/2513; G01R 22/063
See application file for complete search history.

(56) References Cited

U.S. PATENT DOCUMENTS

| 5,565,783 A | 10/1996 | Lau et al. |
| 6,445,188 B1 * | 9/2002 | Lutz ................. G01R 21/06 324/103 R |
| 8,321,160 B2 | 11/2012 | Bryant et al. |

(Continued)

FOREIGN PATENT DOCUMENTS

| CN | 101237099 A | 8/2008 |
| CN | 101237100 A | 8/2008 |

(Continued)

OTHER PUBLICATIONS

Extended European Search Report from corresponding European Application No. 12820079.7 dated Feb. 26, 2015.

(Continued)

*Primary Examiner* — Noam Reisner
(74) *Attorney, Agent, or Firm* — Lando & Anastasi, LLP

(57) ABSTRACT

A cable for monitoring current and voltage includes a plug, a socket, first and second conductors extending from the plug to the socket, a current and voltage monitoring module, a transceiver, and a housing. The current and voltage monitoring module is coupled to the first and second conductors, and is configured to measure current and voltage usage levels of the conductors. The transceiver is coupled to the current and voltage monitoring module and is configured to receive data related to the current and voltage levels and transmit the data related to the current and voltage levels. The housing is configured to house the current and voltage monitoring module, the transceiver and one of the socket and the plug.

15 Claims, 8 Drawing Sheets

(56) References Cited

U.S. PATENT DOCUMENTS

| | | | |
|---|---|---|---|
| 8,949,053 B2 | 2/2015 | Ware | |
| 2005/0060107 A1 | 3/2005 | Rodenberg et al. | |
| 2005/0063116 A1* | 3/2005 | Rotheroe | G01R 19/2513 361/90 |
| 2005/0212526 A1 | 9/2005 | Blades | |
| 2005/0275397 A1 | 12/2005 | Lightbody et al. | |
| 2006/0036380 A1 | 2/2006 | Lee et al. | |
| 2007/0038394 A1* | 2/2007 | Gagnon | G01D 4/008 702/61 |
| 2007/0139188 A1 | 6/2007 | Ollis et al. | |
| 2008/0136607 A1 | 6/2008 | Ratcliff et al. | |
| 2008/0266077 A1 | 10/2008 | Cagno et al. | |
| 2009/0079416 A1* | 3/2009 | Vinden | G01R 22/06 324/103 R |
| 2009/0138732 A1 | 5/2009 | Chang | |
| 2009/0141433 A1 | 6/2009 | Maloney et al. | |
| 2009/0236909 A1 | 9/2009 | Aldag et al. | |
| 2009/0314615 A1 | 12/2009 | Christensen et al. | |
| 2010/0198535 A1 | 8/2010 | Brown et al. | |
| 2011/0029692 A1 | 2/2011 | Chassot et al. | |
| 2012/0143387 A1* | 6/2012 | Indovina | G01R 19/2513 700/297 |
| 2012/0163599 A1 | 6/2012 | Ware et al. | |
| 2012/0274478 A1* | 11/2012 | Stenson | G01F 15/063 340/870.02 |
| 2013/0090869 A1 | 4/2013 | Ewing et al. | |

FOREIGN PATENT DOCUMENTS

| | | |
|---|---|---|
| CN | 201255754 Y | 6/2009 |
| CN | 201528092 U | 7/2010 |
| CN | 102064436 A | 5/2011 |
| EP | 2278344 A2 | 1/2011 |
| JP | 3214073 B2 | 10/2001 |

OTHER PUBLICATIONS

Igor Paprotny: "Self-powered Wireless Sensors for Monitoring the Electric Power Grid", IEEE SCV-PELS, Jan. 19, 2011 (Jan. 19, 2011), pp. 1-33, XP055042555, Retrieved from the Internet: URL:http://ewh.ieee.org/r6/scv/pels/archive/Jan_2011.pdf [retrieved on Oct. 29, 2012].

International Search Report and Written Opinion from corresponding PCT/US2012/048328 dated Dec. 10, 2012.

White R: "Demand Response: Passive Proximity Electric Sensing", Internet Citation, Jun. 10, 2004 (Jun. 10, 2004), XP002372121, Retrieved from the Internet: URL:http://www.ucop.edu/ciee/dretd/white%2Ojune%2010,%202004%20final.pdf [retrieved on Mar. 15, 2006].

* cited by examiner

SYSTEMS AND METHODS FOR CURRENT AND VOLTAGE MONITORING

RELATED APPLICATIONS

This application is a divisional of pending U.S. patent application Ser. No. 13/194,484, filed Jul. 29, 2011, entitled SYSTEMS AND METHODS FOR CURRENT AND VOLTAGE MONITORING, which is incorporated herein by reference in its entirety.

BACKGROUND

Datacenters often include multiple power distribution units (PDU's) contained within equipment racks. Intelligent rack-mounted power distribution units, sometimes referred to as "rack PDU's," provide power for multiple computing devices such as servers contained with the equipment racks. The computing devices typically use large amounts of energy. It is useful to measure the current and voltage used by each of the computing devices and other associated equipment such as cooling units to determine the overall efficiency of the datacenter. Current at an electrical outlet can be measured using wall plug-mounted devices or electrical power strips, but these units can become impractical in PDU's having multiple outlets.

SUMMARY

Systems and methods for current and voltage monitoring inside the housing of a cable socket or plug are provided. According to one aspect, systems and methods for monitoring current and voltage usage by each computing device in a rack are provided.

According to one aspect, a cable for monitoring current and voltage includes a plug, a socket, first and second conductors extending from the plug to the socket, a current and voltage monitoring module, a transceiver, and a housing. The current and voltage monitoring module is coupled to the first and second conductors, and is configured to measure current and voltage usage levels of the conductors. The transceiver is coupled to the current and voltage monitoring module and is configured to receive data related to the current and voltage levels and transmit the data related to the current and voltage levels. The housing is configured to house the current and voltage monitoring module, the transceiver and one of the socket and the plug.

According to one embodiment, the transceiver is configured to use a wireless low power communication protocol to transmit the data related to the current and voltage levels. In one example, the wireless low power communication protocol is IEEE standard 802.15.4.

According to another embodiment, the current and voltage monitoring module is configured to operate in one of a sleep mode and a wake mode. The wake mode may have the transceiver energized for either none or part of the wake time. In another embodiment, the cable includes a capacitor configured to store operating power for at least one of the current and voltage monitoring module and the transceiver. According to a further embodiment, the current and voltage monitoring module is configured to charge the capacitor in a sleep mode of operation.

In one embodiment, the socket is a IEC C13 standard socket. In another embodiment, the plug is a IEC C14 standard plug. In a further embodiment, the cable is a three phase power cable.

According to another aspect, a method for monitoring current and voltage of devices mounted in an equipment rack, includes installing multiple cables in the equipment rack, each of the cables having a current and voltage monitoring module, coupling each of the cables to a computing device in the equipment rack, sending current and voltage data from a transceiver in each of the cables to a server, and monitoring, at the server, the current and voltage data from each of the cables.

According to one embodiment, the method also includes receiving, at a wireless receiver, the current and voltage data, and transmitting the current and voltage data to the server. According to another embodiment, sending voltage and current data includes sending current and voltage data at intermittent intervals. According to one feature, each of the cables sends current and voltage data at different, non-overlapping time intervals.

According to another embodiment, the method also includes intermittently drawing power from a capacitor in the cable for sending current and voltage usage information from the transceiver. In a further embodiment, the method includes intermittently drawing power from the capacitor for powering a current sensor.

In another embodiment, installing multiple power cables includes installing power cables having the current and voltage monitoring module and the transceiver contained in a housing configured to house at least one of a socket end and a plug end of each cable.

According to another aspect, a system is provided that includes an equipment rack having mounting rails for devices to be installed in the rack, multiple computing units mounted on the mounting rails, multiple power cables having current and voltage monitoring circuitry, and a server configured to receive current and voltage data from each of the cables. Each cable is coupled to one of the computing units, and each cable includes a transceiver for sending current and voltage data.

According to one embodiment, the system includes a wireless receiver for receiving the current and voltage data from the transceiver and transmitting the current and voltage data to the server. According to another embodiment, the wireless receiver is configured, in a first mode, to accept transceivers into a network controlled by the wireless receiver and the wireless receiver is configured, in a second mode, to prevent new transceivers from connecting to the network controlled by the wireless receiver. According to one embodiment, the wireless receiver is configured to communicate using a wireless low power communication protocol.

BRIEF DESCRIPTION OF THE FIGURES

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
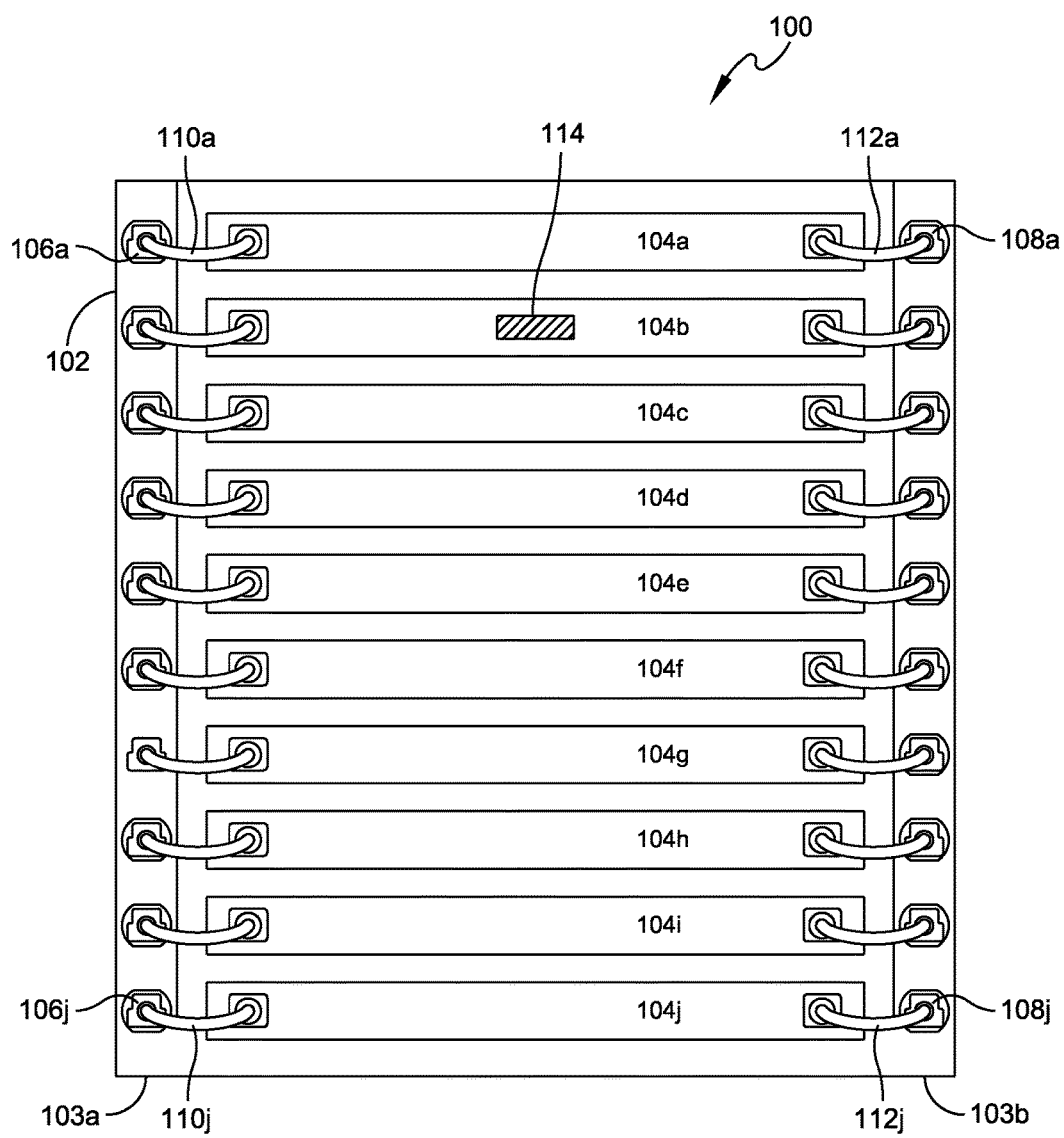
FIG. 1 is a diagram of the back of a rack of servers in accordance with one embodiment of the invention.

Embodiments of this invention are not limited in their application to the details of construction and the arrangement of components set forth in the following description or illustrated in the drawings. Embodiments of the invention are capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

FIG. 1 is a diagram 100 of the back side of an equipment rack 102 containing computing devices 104a-104j according to an embodiment of the invention. The back side of the rack 102 includes two rack-mounted PDU's 103a and 103b each having multiple outlet receptacles 106a-106j and 108a-108j. The computing devices 104a-104j are plugged into the outlet receptacles 106a-106j and 108a-108j with cables 110a-110j and 112a-112j. The computing devices 104a-104j are each plugged in to two outlet receptacles, one outlet receptacle of PDU 103a and one outlet receptacle of 103b. In some embodiments, the PDU's are powered from different sources of power to provide redundant power to the computing devices.

According to one feature, the cables 110a-110j and 112a-112j include current and voltage monitoring technology which monitors the current and voltage usage through each cable 110a-110j and 112a-112j. Additionally, the cables 110a-110j and 112a-112j each include a transceiver which transmits the current and voltage usage measurements from the cable to a wireless receiver. In one example, the wireless receiver 114 is a USB dongle, and the USB dongle is plugged into one of the computing devices 104a-104j. In FIG. 1, the wireless receiver 114 is plugged into the computing device 104b. The computing device 104b receives the current and voltage usage measurements from the wireless receiver 114.

According to one embodiment, a user can view the current and voltage usage measurements using the computing device 104b. The measurements may be used to monitor the current and voltage usage of the computing devices 104a-104j on the rack 102. In one example, a user may use the measurements to determine if one of the computing devices 104a-104j is using an unusually large amount of power. According to one feature, the measurements allow a user to monitor the power usage of each computing device 104a-104j on a rack, and compare the power usage of each computing device 104a-104j with the power usage of the other devices 104a-104j. A user may also compare power usage of computing devices on multiple racks. In one example, the computing devices 104a-104j are servers.

Although the illustrative rack PDU 102 includes ten computing devices, in other embodiments, the rack PDU 102 may include any selected number of computer devices. Similarly, although the illustrative rack PDU 102 includes ten electrical outlets 106a-106j on one side and ten electrical outlets 108a-108j on the other side, and two rack PDU's 103a and 103b, in other embodiments, the rack PDU 102 may include any selected number of electrical outlets on each side, and may include more or less rack PDU's. In one example, the rack PDU's 103a, 103b includes 20 electrical outlets each. In another example, the rack PDU's 103a and 103b include 25 electrical outlets each.

According to one feature, the wireless receiver 114 that receives the current and voltage measurements from the cables is a USB dongle that includes a transceiver that uses a low power, wireless communication standard. In one example, the wireless receiver 114 is a USB dongle with a transceiver that uses a IEEE standard 802.15.4 communication standard. In another example, the wireless receiver 114 is a USB dongle that includes a Zigbee® transceiver. The USB dongle is a peripheral adapter that provides short-range low-power wireless connectivity between wireless transceivers. In one example, the USB dongle is a Digi XStick®. In another example, the wireless communication protocol is Bluetooth. In other examples, the wireless communication protocol may be a similar simple low-power short-range protocol.

According to another embodiment, the wireless receiver 114 is a self-contained unit and is plugged into an outlet receptacle and includes a wired or wireless Ethernet connector and a processor. The wireless receiver 114 is configured to wirelessly receive data from multiple current and voltage monitoring cables. According to one feature, the wireless receiver 114 transmits the data to a computer or a network through a TTL serial interface. In one example, the wireless receiver 114 transmits the data to a Radiocrafts module. According to one feature, when the wireless receiver 114 is plugged into an outlet receptacle, it covers only the one outlet receptacle that it is plugged into and does not obstruct adjacent outlet receptacles.

In one embodiment, the wireless receiver 114 includes one or more rotary switches. The rotary switches may support a selected number of networked transceivers. For example, all the devices in one network may share a Personal Area Network IDentification (PANID) number, and a device may receive traffic only from other devices having the same PANID number. PANID numbers are described in further detail in U.S. patent application Ser. No. 12/976,352 filed Dec. 22, 2010 and titled "Wireless Communication System and Method," assigned to American Power Conversion Corporation, the entirety of which is hereby incorporated by its entirety herein. In one example, the rotary switches support up to about 100 networks. In one embodiment, the wireless receiver 114 includes an LED light, which may be used to indicate whether the wireless receiver is currently accepting new child transceivers to its network. In another embodiment, the wireless transceiver 114 includes a push button, which a user may push to cause the receiver to attempt to reconnect with a child transceiver.

According to one embodiment, pushing and holding a button on the wireless receiver 114 will clear its child transceiver list and cause the wireless receiver 114 to be open to accepting new child transceivers to its network. According to one feature, an LED on the wireless receiver 114 will turn on solid green while it is open to accepting new child transceivers. According to another feature, pressing the button again while the LED is green will put the wireless receiver 114 back into no-join mode, in which it will not accept new child transceivers to its network.

According to another embodiment, a wireless receiver 114 may receive signals from power monitoring devices contained in the power cables for all the devices in a rack PDU. In one embodiment, a standard rack PDU includes 40 unit spaces. In one example, each device on the rack PDU occupies two unit spaces, so a standard rack PDU may contain 20 devices. Each device accepts two input cables, so there are 40 input cables, each having a power monitoring device with a transceiver transmitting current and voltage measurements to the wireless receiver 114. In another embodiment, a tall rack PDU includes 48 unit spaces. In one example, a tall rack PDU includes 24 devices each accepting two input cables. Thus, the tall rack PDU wireless receiver 114 receives signals from 48 cables. According to one feature, the transceiver in each cable transmits data at regular intervals, and the intervals are spaced such that different transceivers transmit data at different times. According to one feature, this conserves the receiving bandwidth of the receiver 114.

Figure 2:
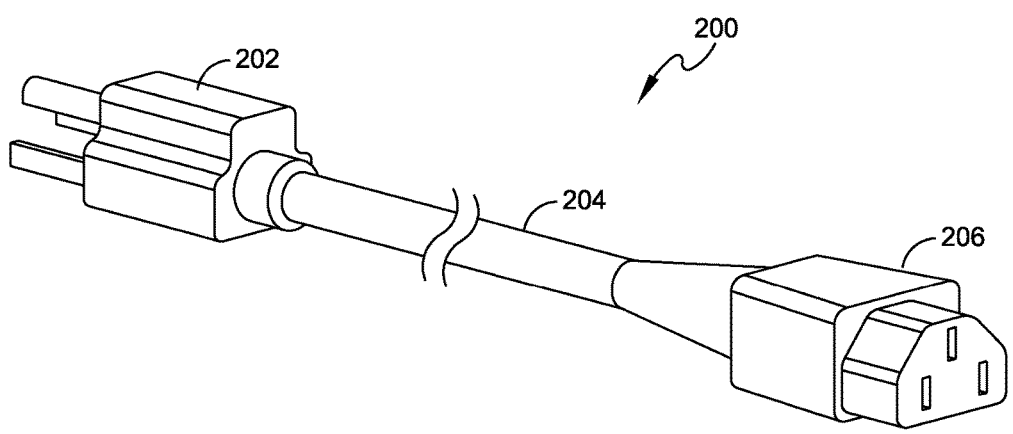
FIG. 2 is a diagram of a plug, cable and socket in accordance with one embodiment of the invention.

FIG. 2 is an illustration of a cable 200 including a plug 202, a cord 204 and a socket 206, according to an embodiment of the invention. The cable includes current and voltage monitoring circuitry and a transceiver. In one embodiment, the current and voltage monitoring circuitry and the transceiver are enclosed in the housing of the socket 206. In another embodiment, the current and voltage monitoring circuitry and the transceiver are enclosed in the housing of the plug 202. The current and voltage monitoring circuitry measures the current and voltage draw from the socket 206. The current and voltage measurements are sent to the transceiver and the transceiver wirelessly transmits the measurements. According to one aspect, the plug 202 of the cable 200 covers only one outlet receptacle of a typical rack PDU.

According to one embodiment, the socket 206 is a standard IEC C13 socket and the plug 202 is a standard IEC C14 plug. According to the IEC C13 standard, the current rating of the socket is 15 A under a UL (Underwriters Laboratories Inc) or CSA (Canadian Standards Association) IEC C13 standard, and the current rating of the socket is 10 A under a VDE (Verband der Electrotechnik) or European IEC C13 standard. The voltage rating is 250 Volts. Under the IEC C13 standard, the two outer pinholes in the socket are spaced 14 mm apart. According to one embodiment, the housing of the socket 206 may be slightly larger than a typical socket housing to accommodate the current and voltage monitoring circuitry, but the socket 206 meets the IEC C13 standard.

According to other embodiment, the socket 206 may be another type of socket and the plug 203 may be another type of plug. In one example, the socket 206 is a type of standard IEC 60320 socket and the plug 203 is another type of standard IEC 60320 plug. In various examples, the socket 206 may be an IEC C1, C3, C5, C7, C9, C11, C15, C15A, C17, C19, C21 or C23 socket. The plus 202 may be a corresponding IEC C2, C4, C6, C8, C10, C12, C16, C16A, C18, C20, C22 or C24 plug.

According to another embodiment, the socket 206 includes a Hall-effect sensor which acts like a push button. When a magnet is waved near the Hall-effect sensor, the sensor acts to reset the transceiver and cause it to search for a wireless receiver. In one embodiment, a magnet may be built into the wireless receiver 114, and the socket 206 may be held in close proximity to the wireless receiver 114 to activate the Hall-effect sensor in the socket 206 and cause it to search for a wireless receiver. In another example, the wireless receiver 114 may be held in close proximity to the socket 206 to activate the Hall-effect sensor. According to one advantage, including a magnet in the wireless receiver 114 allows a user to easily locate a magnet to use to reset the transceiver.

In another embodiment, the magnet used to activate the Hall-effect sensor is an external hand-held magnet. According to one embodiment, pushing the virtual button (or activating the Hall-effect sensor) causes the wireless transceiver to exit a "no-join" mode and search for a wireless receiver. When the wireless transceiver detects a wireless receiver, and the wireless receiver accepts the transceiver to its network, the transceiver returns to the no-join mode. According to one feature, while the wireless transceiver is searching for a receiver, an LED light on the wireless receiver 114 lights up green. Once the wireless transceiver has found a receiver and joined a network, the LED light turns off as the transceiver returns to the no-join mode.

According to one embodiment, when the virtual button on the socket 206 is activated, the transceiver will first attempt to join the network of the receiver to which it was most recently transmitting data. According to one feature, the transceiver attempts to join its previous network first, in case the virtual button was unintentionally pushed. According to one embodiment, an existing child transceiver may attempt to join a wireless receiver network even if the wireless receiver is in a no-join mode and is not accepting new child transceivers if the child transceiver is already on the wireless receiver's list of networked child transceivers. According to one embodiment, the wireless transceivers contain a network number algorithm for PANID (Personal Area Network IDentifier) and an encryption key for accessing the wireless receiver. According to one feature, the wireless transceiver is only active for a short period at a time, and only searches for a wireless receiver during its active period.

According to one embodiment, the current and voltage monitoring circuitry measures the power usage through the socket 206 of the cable 200. The measurements include root mean square (RMS) voltage, RMS current, RMS volt-amperes ((RMS volts)*amperes), and RMS Watts. According to one example, RMS Watts is the sum of multiple samples of (volts*amperes). For example, RMS Watts may be the sum of all the samples of (volts*amperes) from one AC cycle. According to one embodiment, the measurements may include distortion and crest factor. According to another embodiment, a processor in the wireless receiver calculates the power factor of a set of measurements, where the power factor is the ratio of volt-amperes to Watts. According to another aspect, the current and voltage monitoring circuitry is housed in the plug 202 of the cable 200 rather than in the socket 206.

According to one aspect, the firmware for the current and voltage monitoring circuitry may be updated remotely through the wireless communication link to the wireless receiver 114. In one example, serial data for updating the firmware is transmitted to a digital Hall-effect sensor in the current and voltage monitoring circuitry.

According to another aspect, each cable 200 undergoes initial factory testing before use, and the initial factory testing includes identifying a MAC address and a manufacturing date for the cable 200. According to one feature, the MAC address and product serial number are included on a label on the power cord. According to one feature, the factory testing includes calibration of the current sensor's offset and gain. In one example, the current sensor may be calibrated wirelessly by transmitting bit stream data to the digital Hall effect sensor. According to one feature, the digital Hall effect sensor has a bandwidth of about 100 kHz.

Figure 3A:
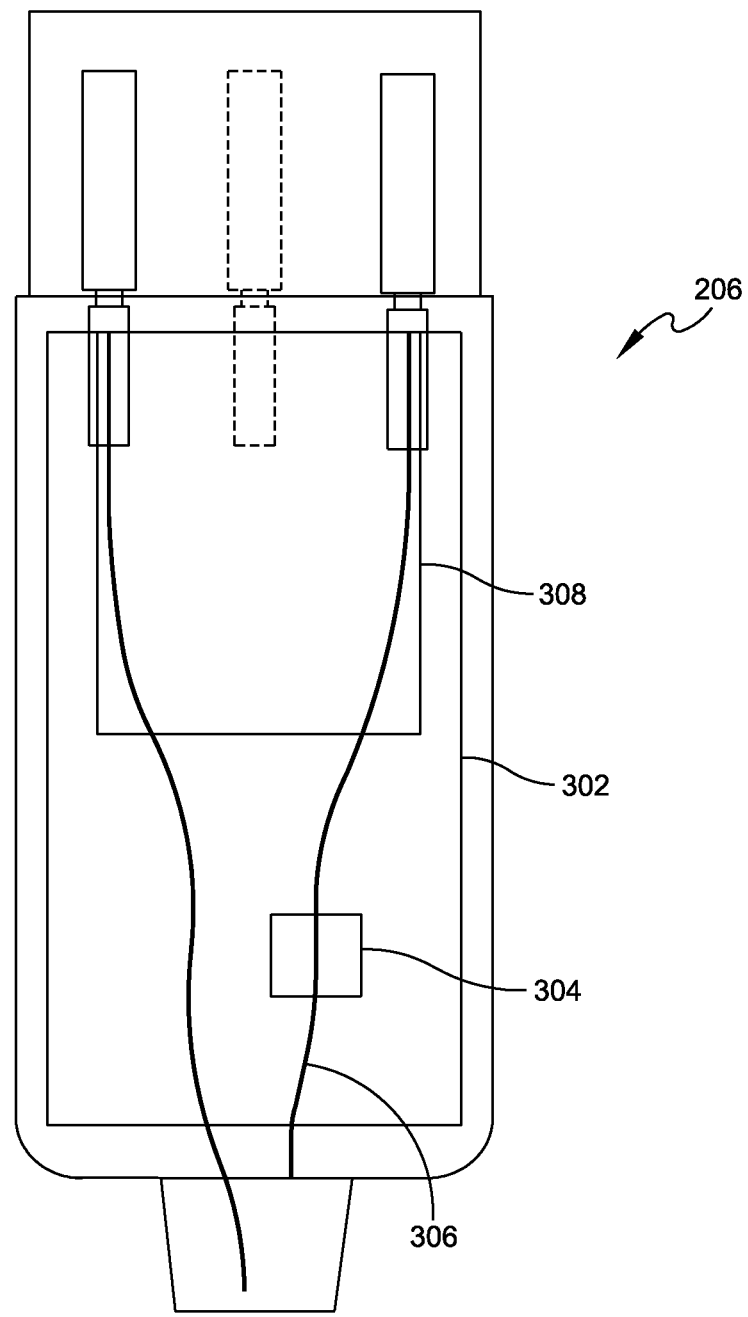
FIG. 3A is a front perspective view of a cable socket showing current and voltage monitoring circuitry in accordance with an embodiment of the invention.

FIG. 3A is a top perspective view of a socket portion 206 of the cable 200 with a portion of the housing removed to show current and voltage monitoring circuitry 302, according to an embodiment of the invention. A current sensor 304 is positioned on the live line 306 of the power conductors in the cable. A power supply capacitor 308 is positioned adjacent to the current and voltage monitoring circuitry 302. The current and voltage monitoring circuitry 302 includes a transceiver for transmitting current and voltage measurements. According to one feature, the power supply capacitor 308 stores incoming power and then provides an extra charge to the transceiver at regular intervals, which the transceiver may use to transmit the recorded current and voltage measurements at regular intervals.

According to one embodiment, the current sensor 304 detects electrical current in the live line 306 and generates a signal proportional to the detected current. In one example, the current sensor 304 is a compact, precision 55 amp current sensor, and it may be designed to operate between about 3V and about 5.5V. The current sensor 304 may have a radial format.

Figure 3B:
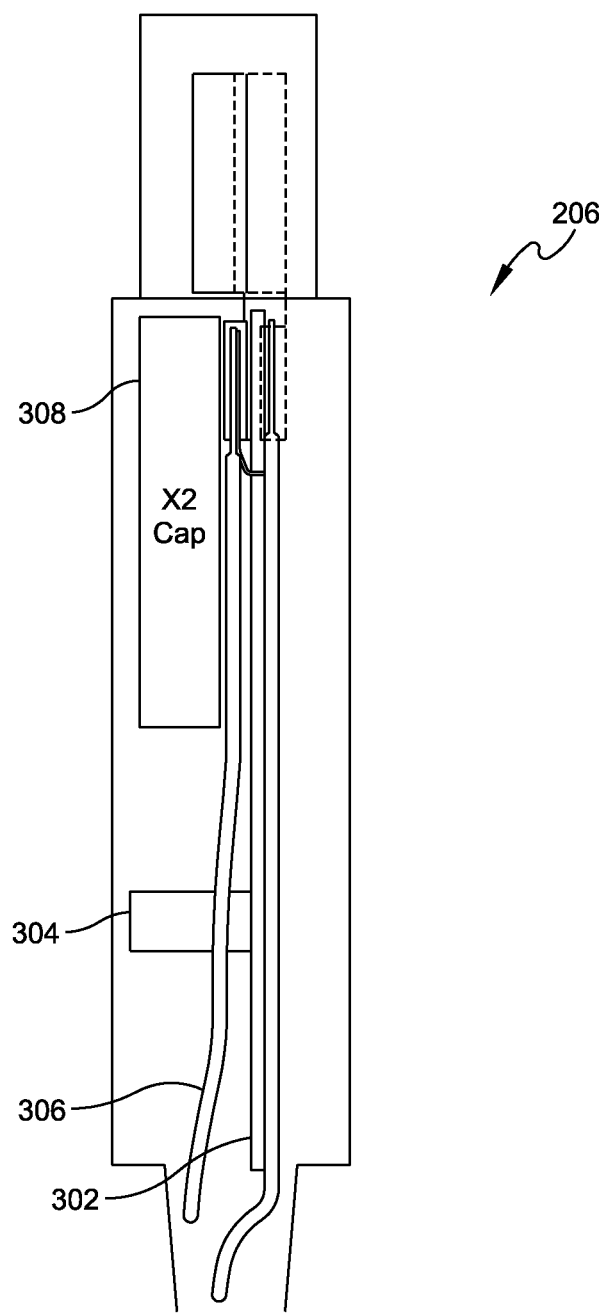
FIG. 3B is a back perspective view of a cable socket showing current and voltage monitoring circuitry in accordance with an embodiment of the invention.

FIG. 3B is a side perspective view of the socket portion 206 of the cable 200 with a portion of the housing removed to show the current and voltage monitoring circuitry 302, according to an embodiment of the invention. The current sensor 304 is shown positioned around the live line 306. The power supply capacitor 308 is positioned adjacent to the current and voltage monitoring circuitry 302. The current and voltage monitoring circuitry 302 is adjacent to the line 306.

Figure 4:
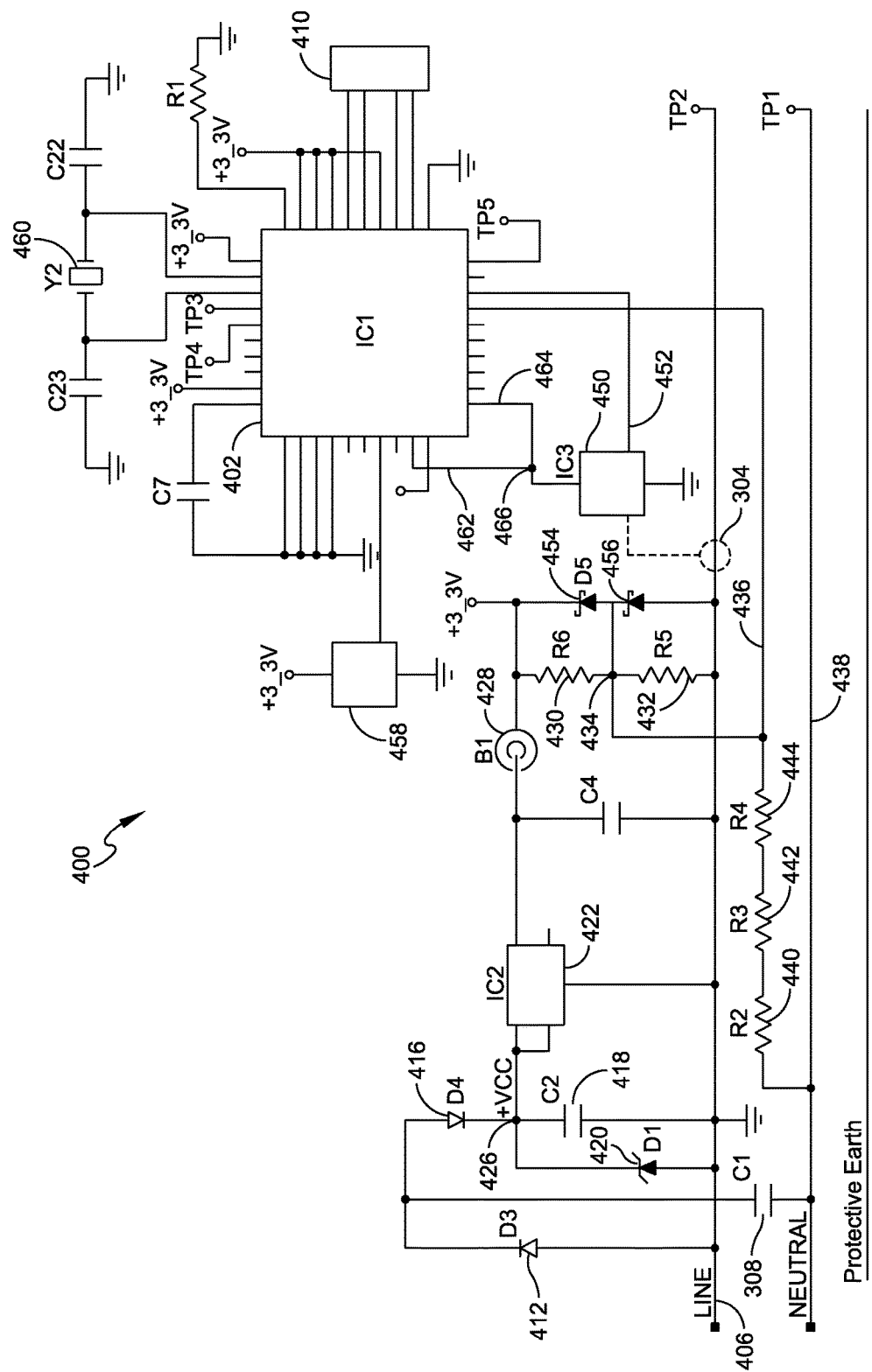
FIG. 4 is a schematic diagram of current and voltage monitoring circuitry in accordance with an embodiment of the invention.

FIG. 4 is a schematic diagram of current and voltage monitoring circuitry 400 including a first integrated circuit 402 having a transceiver, according to an embodiment of the invention. The current and voltage monitoring circuitry 400 also includes a current sensor 304, voltage monitoring circuitry including first 430, second 432, third 440, fourth 442 and fifth 444 resistors. Line 406 is the AC (alternating current) line, and current drawn on line 406 as well as voltage over the line 406 will be measured by the circuitry 400 and transmitted by the transceiver in the integrated circuit 402.

According to one aspect, the power supply capacitor 308 is the main power supply capacitor. During the positive half of the AC cycle, current through the first diode 412 charges the power supply capacitor 308. In one example, the power supply capacitor 308 has a capacitance of 0.33 µF and is rated for 250 VAC. During the negative half of the AC cycle, the power supply capacitor 308 discharges power through a second diode 416 to a main storage capacitor 418. In one example, the main storage capacitor 418 has a capacitance of 47 µF and a voltage of 16V. Between the second diode 416 and the main storage capacitor 418 is a first common node 426. According to one feature, the power supply capacitor 308 charges the main storage capacitor 418. The third diode 420 is a Zener diode and acts as a voltage regulator or a voltage limiter, preventing overcharging of the main storage capacitor 418.

The first common node 426 is coupled to a second integrated circuit 422. According to one feature, the second integrated circuit 422 includes a voltage regulator, that in one embodiment provides an output voltage of 3.3 Volts. According to one feature, the second integrated circuit 422 is coupled to ferrite bead 428, which is used to prevent RF interference.

According to one aspect, a series of resistors form a voltage divider from which voltage may be monitored. A first resistor 430 is coupled in series with a second resistor 432. Between the first resistor 430 and the second resistor 432 is a second common node 434. The second common node 434 is connected to line 436. Line 436 connects the second common node 434 with the first integrated circuit 402. Between the neutral line 438 and the second common node 434 are the third 440, fourth 442 and fifth 444 resistors, connected in series. According to one feature, the third 440, fourth 442 and fifth 444 resistors provide a safety mechanism, such that if one of the third 440, fourth 442 and fifth 444 resistors fails, the other two resistors will provide sufficient resistance to protect the circuit. According to another feature, the voltage monitoring measurements are transmitted to the first integrated circuit 402 through line 436.

According to one embodiment, when the voltage at the neutral line 438 is positive with respect to line 406, it pulls up the center tap between the first resistor 430 and the second resistor 432. Similarly, when the voltage at the neutral line 438 is negative with respect to line 406, it pulls down the center tap between the first resistor 430 and the second resistor 432. In one example, the voltage at the neutral line 438 is positive 354 Volts. In another example, the voltage at the neutral line 438 is negative 354 Volts with respect to line 406. According to one feature, the second common node 434 is connected to a point between fourth 454 and fifth 456 Schottky diodes. In one example, the fourth 454 and fifth 456 diodes act as protection diodes against voltage surges on the AC line 406.

According to one aspect, a third integrated circuit 450 measures the current on the line 406 through a current sensor 304. The third integrated circuit 450 is coupled to the first integrated circuit 402 and receives input from the first integrated circuit 402 through lines 462 and 464. Lines 462 and 464 are high current outputs from the first integrated circuit 402. Lines 462 and 464 are paralleled at a fourth common node 466 and provide power to the integrated circuit 450. According to one feature, the output line 452 from the third integrated circuit 450 to the first integrated circuit 402 carries a voltage of about 1.65 Volts. According to one example, the output voltage of 1.65 Volts is about half scale. According to another feature, the output line 452 from the third integrated circuit 450 to the first integrated circuit 402 carries 15 mV/A. According to one feature, a zero calibration and a gain calibration factor for the current sensor 304 are calculated wirelessly during configuration of the current and voltage monitoring circuitry 400, and stored as reference values.

According to one aspect, the transceiver in the first integrated circuit 402 is coupled to antenna circuitry 410. The transceiver in the first integrated circuit 402 uses the antenna circuitry 410 to transmit the current and voltage measurements. According to one embodiment, the transceiver and the first integrated circuit 402 have a sleep current of about 1.4 µA and includes multiple accurate A/D channels.

According to another feature, the current and voltage monitoring circuitry 400 includes a fourth integrated circuit 458. The integrated circuit 458 is configured to allow a user to turn on the transceiver and cause the transceiver to pair with a master receiver. In one embodiment, when a magnet is placed in close proximity, the integrated circuit 458 senses the magnet and causes the switch to close, turning on the transceiver. The use of the magnet and switch provides a user interface without a physical hole in the housing that could affect the integrity of the housing.

According to one feature, the power supply capacitor 308 stores energy for the integrated circuit and transceiver 402 to use when it is awake. In some embodiments, the integrated circuit and transceiver 402 may draw a maximum amount of current from the main storage capacitor 418 at a time, and the power supply capacitor 308 may provide power needed by the integrated circuit and transceiver 402 that exceeds the maximum amount. In one example, the maximum current the integrated circuit and transceiver 402 may continuously draw from the main power storage capacitor 418 is about 6.2 mA.

In one embodiment, the power supply capacitor 308 is a 47 μF capacitor and is charged to 14V. In one example, the power supply capacitor 308 discharges linearly at a rate proportional to the current. According to one embodiment, the power supply capacitor 308 and the main power storage capacitor 418 form a capacitor divider that steps-down the AC voltage for use in the power supply. According to one embodiment, the current and voltage monitoring circuitry is configured to turn on for selected time periods without turning on the transceiver.

The current and voltage monitoring circuitry 400 includes a crystal 460, coupled to the first integrated circuit 402. The crystal 460 functions to periodically wake up the integrated circuit 402. In one embodiment, the integrated circuit 402 is in a sleep mode the majority of the time. The crystal 460 wakes up the integrated circuit 402 for one line cycle and then the integrated circuit 402 returns to a sleep mode. In one example, the integrated circuit 402 samples the current and voltage usage measurements 32 times during one line cycle. In another example, the integrated circuit 402 samples the current and voltage usage measurements 20 times during one line cycle. In a further example, the integrated circuit 402 samples the current and voltage usage measurements 16 times during one line cycle. In another example, the integrated circuit 402 samples the current and voltage usage measurements 25 times over a 25 ms period, thereby taking one sample per millisecond.

According to one feature, the integrated circuit 402 wakes up, takes some samples, and then goes to sleep. A few cycles later, the integrated circuit 402 wakes up again without turning on the transceiver and completes power calculations for the sample taken. The integrated circuit 402 determines whether the calculations have changed from previously transmitted calculations by a predetermined, configurable amount and if so, prepares to transmit the calculations before going to sleep. A few cycles later, if determined necessary, the integrated circuit 402 and the transceiver wake up and the transceiver transmits the calculations. In one embodiment, if the calculations have not changed by more than a predetermined amount, then the transceiver does not transmit the calculations. According to one example, the integrated circuit 402 wakes up once every five AC cycles to take measurements. In other examples, the integrated circuit 402 wakes up to take measurements once every ten AC cycles, once every 20 AC cycles, once every 50 AC cycles, or once every 100 AC cycles.

According to one embodiment, the current sensor circuitry draws 9 mA. According to one feature, the current sensor is turned on as infrequently as possible since it draws more current than the main storage capacitor 418 can continuously supply. In one example, the current sensor has a 3.5 μs settling time and the ADC takes 132 μs for a 12-bit reading. This is a 14% duty cycle, which equates to 1.26 mA average in addition to the 10 mA the processor draws. In another example, the ADC takes 68 μs for a 10-bit reading.

Figure 5:
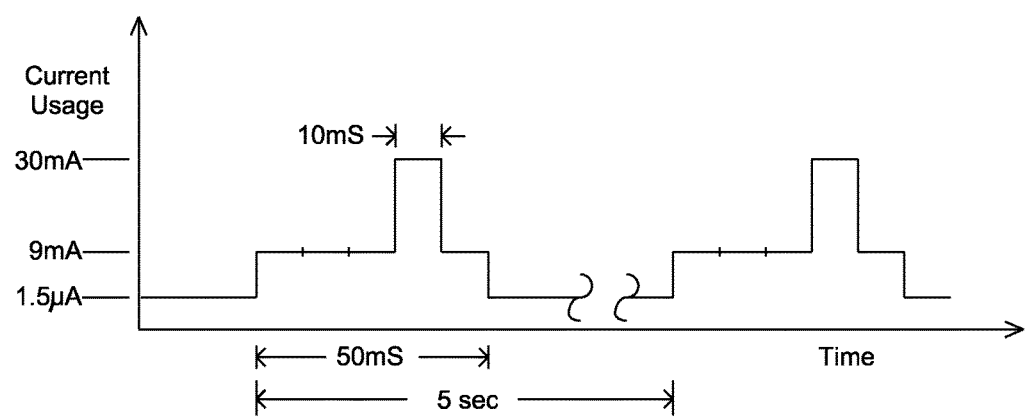
FIG. 5 is a chart showing an exemplary sleep-wake cycle of an integrated circuit and transceiver in accordance with an embodiment of the invention.

FIG. 5 is a chart showing an exemplary sleep-wake cycle of an integrated circuit and transceiver 402. Note that the chart 500 is not drawn to scale. The x-axis of the chart shows time and the y-axis shows current usage. According to this example, over a five second period, the integrated circuit and transceiver 402 is awake for 50 ms. During the 50 ms the integrated circuit 402 is awake, it is measuring current and voltage usage through the live line 406. During 40 ms of the 50 ms the integrated circuit 402 is awake, it is consuming approximately 9 mA of current. During 10 ms of the 50 ms the integrated circuit 402 is awake, it is also transmitting the current and voltage usage measurements, and consuming approximately 30 mA of current.

According to one feature, configuring the integrated circuit and transceiver 402 to follow a sleep-wake cycle in which it is in a sleep mode the majority of the time, saves power, minimizing the size of the power supply capacitor 308. According to one feature, minimizing the size of the power supply capacitor 308 allows the current and voltage monitoring circuitry 400 to physically fit inside the housing of the socket 206 or the plug 202.

According to one example, the efficiency of a data center may be calculated using a power usage effectiveness (PUE) algorithm:

PUE=(total facility load)/(computing load)

where the total facility load is the total amount of power used by the data center, including power for cooling, lighting and other overhead power usage, and the computing load is the power used by the computing equipment. The PUE provides data center operators with an effective measure of the efficiency of data centers, but determination of the PUE with accuracy is often difficult. While determination of the total power of the data center can be straightforward, it is often difficult to determine how much of the total load is due to the computing equipment in the data center. Embodiments of the invention can be used to measure power usage by all computing equipment in a data center, resulting in a more accurate determination of the PUE.

Figure 6:
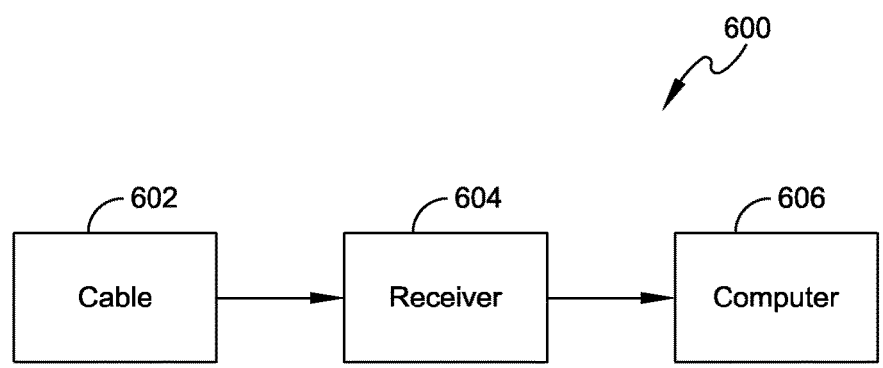
FIG. 6 is a schematic diagram of a system for monitoring the current and voltage usage of multiple devices in accordance with an embodiment of the invention.

FIG. 6 is a schematic diagram of a system 600 for monitoring the current and voltage usage of multiple devices. The system 600 includes a cable 602 having the current and voltage monitoring circuitry as well as a transceiver that uses a wireless low power communication standard, a wireless receiver 604 that uses a wireless low power communication standard, for receiving the current and voltage usage levels transmitted from transceiver in the cable 602, and a computer 606 coupled to the wireless receiver 604. In one example, the wireless low power communication standard is IEEE standard 802.15.4. In another example, the wireless low power communication standard is a Zigbee® standard. The computer 606 may monitor the current and voltage usage information from the cable, or a user may use the computer 606 to monitor the current and voltage usage information. According to one embodiment, multiple cables 602 are installed in a rack PDU and wirelessly transmit the current and voltage levels via a transceiver that uses a wireless low power communication standard. According to one feature, the wireless receiver 604 receives the current and voltage levels from multiple cables 602 and the computer 606 monitors the current and voltage usage information from the cables 602.

Figure 7:
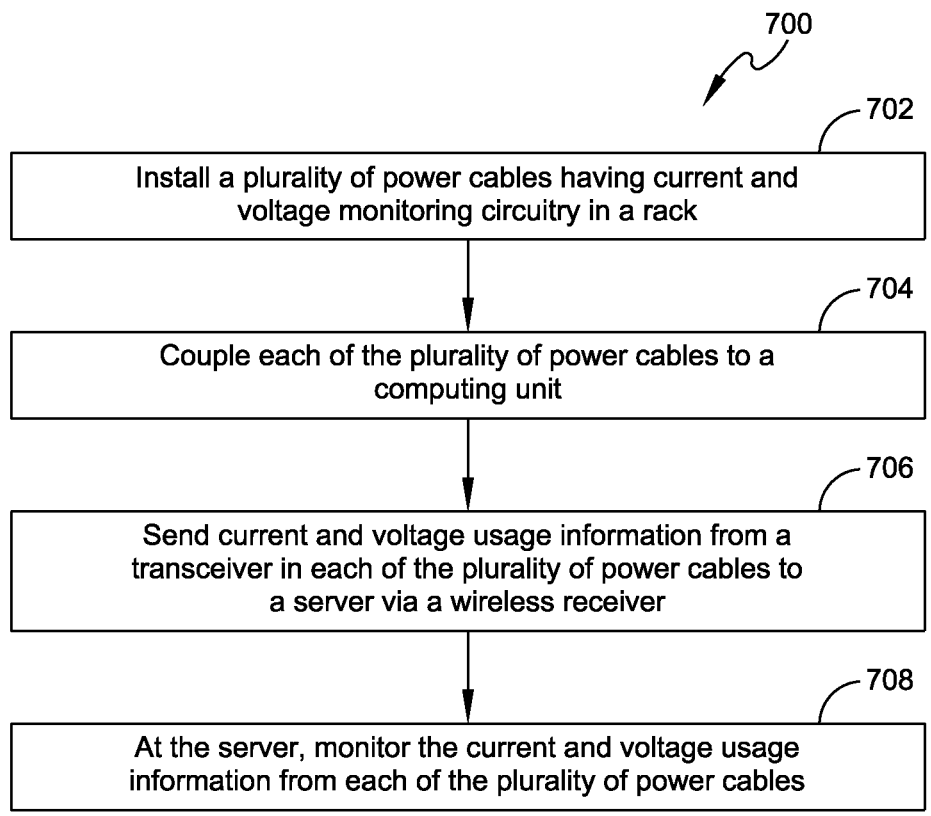
FIG. 7 is a flow chart of a method of monitoring the current and voltage usage of multiple devices in accordance with an embodiment of the invention.

FIG. 7 is a flow chart of a method 700 of monitoring the current and voltage usage of multiple devices. At block 702, the plug end of multiple cables having current and voltage monitoring circuitry are coupled to multiple power outlets in a rack. At block 704, the socket end of each cable is coupled to a computing unit. The current and voltage monitoring circuitry in each cable measures current and voltage usage, and at block 706, a wireless transceiver in each cable transmits the measurements to a server via a wireless receiver. According to one embodiment, voltage measurements are not taken during transmission by the wireless transceiver, since the transmit current could affect the voltage measurements. In one example, the wireless transceiver and the wireless receiver may use a wireless low power communication standard. In one example, the wireless low power communication standard is IEEE standard 802.15.4. In another example, the wireless low power communication standard is a Zigbee® standard. At block 708, the current and voltage usage information from each cable is monitored at the server. In one example, the server automatically monitors the current and voltage information. In another example, a user monitors the current and voltage usage information collected at the server.

According to one embodiment, the systems and methods disclosed herein are implemented in a three-phase power cord. In this embodiment, the current and voltage monitoring circuitry includes three current sensing circuits (one per phase) and three voltage detection circuits (one per phase), and one transceiver, one first integrated circuit, one power supply capacitor 308 and one main storage capacitor 418. According to other embodiments, systems and methods disclosed herein may be implemented in other multiphase power cords.

The systems and methods disclosed herein may provide an automated, easy to use, on location device for making measurements and calculations for the user to maximize efficiency and increase system reliability. Embodiments may include a customer configurable set of variables and/or limits to consider in performing the automated calculations in order to provide customer the maximum flexibility in using the automated tools in a way that matches their desired level of safety. The systems and methods may be used in conjunction with power monitoring software to further provide comprehensive checks of available power, consider historic and/or real-time (i.e., maximum and/or average loading information) data, and consider power source losses in redundant systems, as well as the user configurable maximum load thresholds to ensure the user or operator configures attached loads for maximum robustness and conformity to the user policy preferences to minimize probability of overload and dropped loads.

The embedded measurements, algorithms and calculations of data disclosed herein may be configured to provide recommendations for optimal configuration of power connections of attached equipment and other recommendations as described herein. Embodiments may include utilizing communication methods from external devices. Such external devices may include other rack PDU's, other hardware (e.g., remote power panels or feeder PDU's), and/or other external software, such as APC Infrastruxure Central offered by American Power Conversion Corporation of West Kingston, R.I., or third party applications, and processing of this data embedded into the rack PDU itself to provide user recommendations and/or calculated data based on the external information and the data collected within the rack PDU itself. Embodiments further include a display built into the rack PDU, such as LCD, LED, or other type of display, and any associated user interface which may be interactive to display measurements or recommendations real time to a user at the rack PDU. Alternative embodiments may include an optional external display connected directly to the rack PDU, such as LCD, LED, or other type of display, and any associated user interface which may be interactive to display the measurements or recommendations real-time to a user at the rack PDU. Methods to transmit this data to remote locations via an embedded web interface, SNMP, serial, or any other communication method of the information processed in the rack PDU to other devices may further be provided.

In certain embodiments, the measurements may be logged in an embedded memory of a network management card of the PDU, for example, for data analysis purposes. Operators may utilize the measurement data, particularly the current and power data, in order to achieve certain performance improvements. For example, such measurement data may be used to monitor the current draw to avoid circuit overloads. Another use for measurement data may be to track power usage for capacity or cooling planning.

In embodiments described above, power monitoring and transceiver circuitry is primarily described as being contained in a housing at a socket end of a power cord. In other embodiments, the circuitry may be contained in a housing at the plug end of a power cord or in housing at any point between the plug end and the socket end of a power cord.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. For example, alternative configurations of electrical components may be utilized to produce similar functionality, for example, transceiver functions, or other functions. Accordingly, the foregoing description and drawings are by way of example only.

What is claimed is:

1. A cable, comprising; a plug at a first end of the cable; a socket at a second end of the cable; first and second conductors extending from the plug to the socket; a current and voltage, monitoring module coupled to the first and the second conductors and configured to measure current and voltage levels of the conductors; a transceiver coupled to the current and voltage monitoring, module, configured to receive data related to the current and voltage levels and transmit the data related to the current and voltage levels; and a housing configured to house the current and voltage monitoring module, the transceiver, and one of the socket and the plug, wherein the current and voltage monitoring module is configured to cycle between a sleep mode and a wake mode, and in a first wake mode cycle determine if received data related to current and voltage levels has changed by a predetermined amount, and in response to the change in current and voltage levels being over the predetermined amount, provide the received data to the transceiver for transmission by the transceiver in a next wake mode cycle.

2. The cable of claim 1, wherein the transceiver is configured to use a wireless low power communication protocol to transmit the data related to the current and voltage levels.

3. The cable of claim 2, wherein the wireless low power communication protocol is IEEE standard 802.15.4.

4. The cable of claim 1, further comprising a capacitor configured to store operating power for at least one of the current and voltage monitoring module and the transceiver.

5. The cable of claim 4, wherein the current and voltage monitoring module is configured to charge the capacitor during the sleep mode.

6. The cable of claim 1, wherein the socket is a IEC C13 standard socket.

7. The cable of claim 1, wherein the plug is a IEC C14 standard plug.

8. The cable of claim 1, wherein the cable is a three phase cable.

9. The cable of claim 1, wherein the voltage and current monitoring module is configured such that at least one sleep mode cycle occurs between the first wake mode cycle and the subsequent wake mode cycle.

10. A method of operating a monitoring module contained in a housing, coupled to a cable, the method comprising: during a first wake cycle of the monitoring module, measuring at least one of voltage and current data associated with conductors of the cable; and determining, during a second wake cycle, if the at least one of voltage and current data has changed from a previous measurement by more than a predetermined amount, and in response to the change in current and voltage levels being over the predetermined amount, transmitting the data related to the at least one of the voltage and current data during a third wake cycle using a transmitter contained in the housing.

11. The method of claim 10, wherein transmitting the data includes transmitting the data using a wireless low power communication protocol.

12. The method of claim 10, further comprising conducting calculations using the at least one of the current and voltage data during the second wake cycle occurring between the first wake cycle and the third wake cycle.

13. The method of claim 10, further comprising controlling the monitoring module to operate in at least one sleep cycle between the first wake cycle and the second wake cycle.

14. The method of claim 13, wherein the housing further includes a capacitor coupled to the monitoring module, and wherein the method further includes charging the capacitor during the at least one sleep cycle.

15. The method of claim 12, further comprising controlling the monitoring module to operate in at least one sleep cycle between the first wake cycle and the second wake cycle, and controlling the monitoring module to operate in at least one sleep cycle between the second wake cycle and the third wake cycle.

* * * * *